US011011397B2

(12) United States Patent
Baggett

(10) Patent No.: US 11,011,397 B2
(45) Date of Patent: May 18, 2021

(54) WAFER SOAK TEMPERATURE READBACK AND CONTROL VIA THERMOCOUPLE EMBEDDED END EFFECTOR FOR SEMICONDUCTOR PROCESSING EQUIPMENT

(71) Applicant: Axcelis Technologies, Inc., Beverly, MA (US)

(72) Inventor: John Baggett, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 337 days.

(21) Appl. No.: 16/227,399

(22) Filed: Dec. 20, 2018

(65) Prior Publication Data

US 2020/0203199 A1     Jun. 25, 2020

(51) Int. Cl.
  *H01L 21/67*     (2006.01)
  *H01L 21/683*    (2006.01)
  *H01L 21/687*    (2006.01)

(52) U.S. Cl.
  CPC .. *H01L 21/67248* (2013.01); *H01L 21/67115* (2013.01); *H01L 21/6833* (2013.01); *H01L 21/68707* (2013.01)

(58) Field of Classification Search
  CPC ......... H01L 21/67248; H01L 21/67115; H01L 21/6833; H01L 21/68707; H01L 21/67751
  See application file for complete search history.

(56) References Cited

U.S. PATENT DOCUMENTS

| | | | |
|---|---|---|---|
| 2010/0211203 A1* | 8/2010 | Oka | H01L 21/67103 700/103 |
| 2013/0180448 A1* | 7/2013 | Sakaue | H01L 21/67742 118/696 |

(Continued)

FOREIGN PATENT DOCUMENTS

KR     20120007980 U     11/2012

OTHER PUBLICATIONS

International Search Report and Written Opinion dated Feb. 11, 2020 in connection with International Application PCT/US2019/061097.

*Primary Examiner* — Ratisha Mehta
*Assistant Examiner* — Md M Islam
(74) *Attorney, Agent, or Firm* — Eschweiler & Potashnik, LLC

(57) ABSTRACT

A workpiece processing system and method provides an end effector coupled to a workpiece transfer apparatus. The end effector has support members for selectively contacting and supporting a workpiece. One or more temperature sensors are coupled to the support members and are configured to contact a backside of the workpiece to measure and define one or more measured temperatures of the workpiece. A heated chuck has a support surface at a predetermined temperature, and is configured to radiate heat from the support surface. A controller control the workpiece transfer apparatus to selectively support the workpiece at a predetermined distance from the support surface of the heated chuck to radiatively heat the workpiece, and to selectively transfer the workpiece from the end effector to the support surface of the heated chuck based, at least in part, on the one or more measured temperatures.

20 Claims, 5 Drawing Sheets

(56) References Cited

U.S. PATENT DOCUMENTS

| | | | |
|---|---|---|---|
| 2013/0345871 A1* | 12/2013 | Kimura | B25J 9/1694 |
| | | | 700/258 |
| 2017/0004987 A1* | 1/2017 | Fairbairn | H01L 21/67259 |
| 2018/0096875 A1 | 4/2018 | Weed | |
| 2018/0204755 A1 | 7/2018 | Baggett | |

* cited by examiner

WAFER SOAK TEMPERATURE READBACK AND CONTROL VIA THERMOCOUPLE EMBEDDED END EFFECTOR FOR SEMICONDUCTOR PROCESSING EQUIPMENT

FIELD

The present disclosure relates generally to workpiece processing systems and methods for processing workpieces, and more specifically to a system and method for controlling a temperature of a workpiece prior to being placed on a temperature-controlled surface.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 300° C.-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50° C.-100° C.

Hot implants, for example, are becoming more common, whereby the process temperature is typically achieved via a heated chuck, where the workpiece is generally fixed to a clamping surface of the heated chuck during implantation by electrostatic force or mechanical clamping. For example, a heated electrostatic chuck (ESC) holds or clamps the workpiece using electrostatic force, while mechanical clamping mechanically maintains a position of the workpiece relative to the heated chuck by mechanical means. A conventional high temperature ESC, for example, comprises a set of heaters embedded under the clamping surface for heating the ESC and workpiece to the process temperature (e.g., 300° C.-600° C.), whereby a gas interface conventionally provides a thermal interface from the clamping surface to the backside of the workpiece.

Placement of a relatively cool workpiece on a surface of the heated chuck, however, can lead to various problems when the workpiece thermally expands or grows with respect to the clamping surface due to the increase in temperature. Such expansion can lead to warpage or cracking of the workpiece, and such expansion is particularly problematic when the workpiece comprises silicon carbide. Further, when the cool workpiece is placed on the surface of the heated chuck, a substantially steep rate of heating is induced in the workpiece, whereby thermal non-uniformities may be induced across the workpiece, thus further leading to problems such as thermal stress and breakage of the workpiece.

SUMMARY

The present disclosure overcomes the limitations of the prior art by providing a system, apparatus, and method for measuring a temperature of a workpiece prior to the workpiece being placed in contact with a heated support. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is directed generally toward a workpiece processing system, such as an ion implantation system. In accordance with one exemplary aspect, the workpiece processing system comprises a workpiece transfer apparatus having an end effector operably coupled thereto. The workpiece, for example, may rest on the end effector, whereby the end effector restrains the workpiece in only one degree of freedom. The workpiece transfer apparatus, for example, is configured to selectively transfer the workpiece between various chambers or stations, such as a process chamber, load lock chamber, preheat station, or other station of the ion implantation system.

One or more temperature sensors, for example, are operably coupled to the end effector, wherein the one or more temperature sensors are configured to contact a backside of the workpiece. The one or more temperature sensors are further configured to respectively measure one or more temperatures of the workpiece, therein respectively defining one or more measured temperatures. In one example, the one or more temperature sensors comprise one or more of thermocouple and an RTD.

The end effector, for example, comprises three or more support members operably coupled to the end effector, wherein the three or more support members are configured to selectively contact and support the workpiece. In another example, the one or more temperature sensors are operably coupled at least one of the three or more support members. In yet another example, three or more temperature sensors are operably coupled to the three or more support members, respectively, whereby each support member has a temperature sensor associated therewith.

In accordance with another exemplary aspect, a thermal apparatus is provided, wherein the thermal apparatus has a support surface that is thermally controlled to a predetermined temperature. In one example, the thermal apparatus comprises a heated apparatus configured to be selectively heated to the predetermined temperature, and is configured to radiate heat from the support surface. The thermal apparatus may be further configured to selectively clamp the workpiece to the support surface. In one example, the heated apparatus comprises a heated chuck, such as a heated electrostatic chuck. The heated apparatus, for example, may be positioned within a process chamber, wherein the process chamber is at a substantial vacuum.

The heated chuck, for example, is further configured to heat the workpiece to a predetermined processing temperature. The predetermined processing temperature, for example, can range from approximately 100° C. to approximately 1200° C.

A controller, for example, is further provided and configured to control the workpiece transfer apparatus to selectively support the workpiece at a predetermined distance from the support surface of the thermal apparatus. The workpiece, for example, may be radiatively heated by the thermal apparatus. In another example, the controller is configured to selectively transfer the workpiece from the end effector to the support surface of the thermal apparatus based, at least in part, on the one or more measured temperatures.

In one example, the controller is configured to control the workpiece transfer apparatus in order to selectively vary the predetermined distance based, at least in part, on the measured temperature. The controller, for example, may be configured to selectively transfer the workpiece from the end effector to the support surface of the thermal apparatus based, at least in part, on a rate of change of the measured temperature.

In accordance with another example, the controller is configured to selectively transfer the workpiece from the end effector to the support surface of the thermal apparatus based, at least in part, on the measured temperature reaching a threshold temperature associated with the predetermined temperature. The threshold temperature, for example, may be within approximately 5 percent of the predetermined temperature.

According to another exemplary aspect, a method for controlling a temperature of a workpiece is provided. The method comprises measuring a temperature of a backside surface of the workpiece when the workpiece resides on an end effector above a clamping surface of a thermal chuck. The temperature of the backside of the workpiece is measured, for example, via a temperature sensor contacting the backside surface, therein defining a measured temperature. In one example, the workpiece is transferred from the end effector to the support surface of the thermal chuck based, at least in part, on the measured temperature.

To the accomplishment of the foregoing and related ends, the invention comprises the features hereinafter fully described and particularly pointed out in the claims. The following description and the annexed drawings set forth in detail certain illustrative embodiments of the disclosure. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
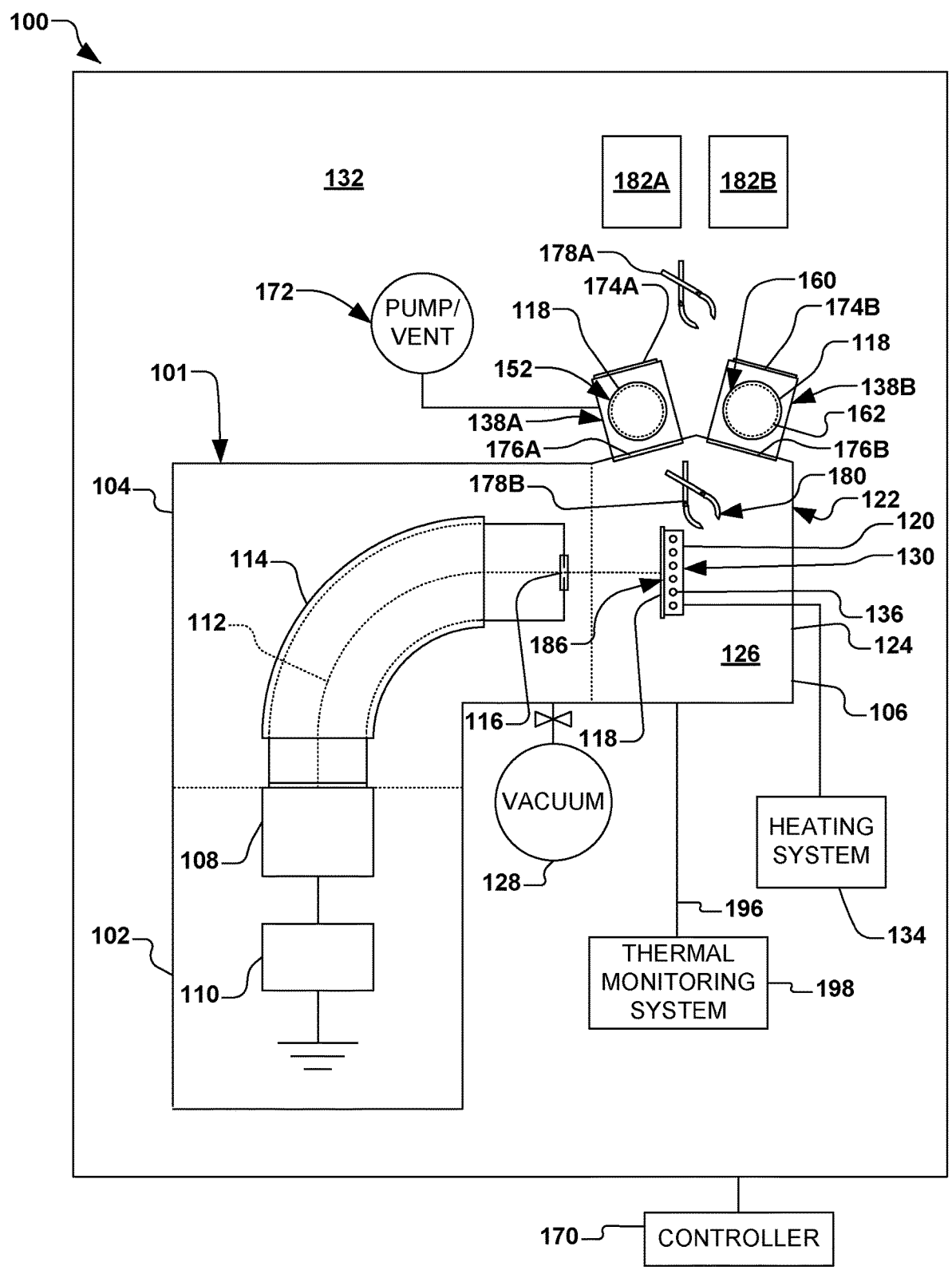
FIG. 1 illustrates a block diagram of an exemplary heated ion implantation system in accordance with an aspect of the present disclosure.

The present disclosure is directed generally toward semiconductor processing systems, and more particularly, to workpiece transfer system having an end effector configured to determine a temperature of a workpiece. The present disclosure is provides systems having a heated workpiece support configured to receive a relatively cool workpiece from the end effector. In one embodiment, the present disclosure relates to ion implantation systems, and more particularly, to an ion implantation system configured for hot ion implantation (e.g., 300° C.-600° C.). However, it should be understood that the present disclosure is applicable to various other systems where a relatively cool workpiece is placed on a relatively hot surface.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

The present disclosure appreciates that precision and control of temperatures of a workpiece are having greater and greater significance in processing of semiconductor workpieces. Conventional systems are typically configured to measure and control the temperature of a workpiece support (e.g., an electrostatic chuck) on which the workpiece resides, whereby characterization and analysis of the temperature of the workpiece support are utilized to infer the temperature of the workpiece, as opposed to the measuring the temperature of the workpiece, itself. However, the disclosure presently appreciates that such a reliance on the temperature of the workpiece support can lead to various problems during processing of the workpiece.

In accordance with various aspects of the present disclosure, FIG. 1 illustrates an exemplary ion implantation system 100. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a thermal chuck 120. The thermal chuck 120, for example, may comprise an electrostatic chuck (ESC) or mechanical clamp chuck, wherein the thermal chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100° C.-600° C. or greater). Thus, in the present example, the thermal chuck 120 comprises a heated chuck 130 (e.g., a thermal apparatus), wherein the heated chuck is configured to support and retain the workpiece 118 while further heating the workpiece 118 within the process chamber 122 prior to, during, and/or after the exposure of the workpiece to the ion beam 112.

The heated chuck 130, for example, comprises an electrostatic chuck (ESC) configured to heat the workpiece 118 to a processing temperature that is considerably greater than an ambient or atmospheric temperature of the surroundings or external environment 132 (e.g., also called an "atmospheric environment"). It should be noted, however, that the heated chuck 130 may alternatively comprise a chuck having mechanical clamps (not shown) for selectively securing the workpiece 118 thereto. In another alternative, the heated chuck 130 may comprise any heated support apparatus configured to selectively support the workpiece 118.

A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 disposed within the heated chuck 130. In one alternative, the heating system 134 comprises a radiant heat source, such as one or more a halogen lamp, light emitting diode, and infrared thermal device configured to selectively heat the workpiece 118.

For some high temperature implants, the workpiece 118 may allowed to "soak" on the heated chuck 130 within the vacuum of the process environment 126 until the desired temperature is reached. Alternatively, in order to increase cycle time through the ion implantation system 100 the workpiece may be preheated in one or more chambers 138A, 1388 (e.g., one or more load lock chambers) operatively coupled to the process chamber 122 via a pre-heat apparatus 152 (e.g., a thermal apparatus).

Depending on the tool architecture, process, and desired throughput, the workpiece 118 may be preheated to the first temperature via the pre-heat apparatus 152, wherein the first temperature is equal to or lower than the process temperature, thus allowing for a final thermal equalization on the heated chuck 130 inside the vacuum chamber 124. Such a scenario allows the workpiece 118 to lose some heat during transfer to the process chamber 122, wherein final heating to the process temperature is performed on the heated chuck 130. The pre-heat apparatus 152 associated with the one or more chambers (e.g., illustrated in chamber 138A in FIG. 1), for example, can heat the workpiece 118 at the atmospheric pressure of the external environment 132 prior to bringing the workpiece to the vacuum of the process environment 126 of the process chamber 122.

Alternatively, the workpiece 118 may be preheated via the pre-heat apparatus 152 from an initial temperature (e.g., room temperature) to a first temperature that is higher than the process temperature. Accordingly, the first temperature can be optimized so that cooling of the workpiece 118 during transfer to the process chamber 122 is just enough for the workpiece to be at the desired process temperature as it is clamped onto the heated chuck 130.

In order to accurately control and/or accelerate the thermal response and enable an additional mechanism for heat transfer, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 μm), and as such, the molecular mean free path in this pressure regime becomes large enough for the interface thickness to push the system into the transitional and molecular gas regime.

In accordance with another aspect of the disclosure, chamber 1388 comprises a cooling apparatus 160 (e.g., a thermal apparatus) configured to cool the workpiece when the workpiece 118 is disposed within the chamber 1388 subsequent to being implanted with ions during ion implantation. The cooling apparatus 160, for example, may comprise a chilled workpiece support 162, wherein the chilled workpiece support is configured to actively cool the workpiece 118 residing thereon via thermal conduction. The chilled workpiece support 162, for example, comprises a cold plate having a one or more cooling channels passing therethrough, wherein a cooling fluid passing through the cooling channel substantially cools the workpiece 118 residing on a surface of the cold plate. The chilled workpiece support 162 may comprise other cooling mechanisms, such as Peltier coolers or other cooling mechanisms known to one of ordinary skill.

In accordance with another exemplary aspect, a controller 170 is further provided and configured to selectively activate one or more of the heating system 134, the pre-heat apparatus 152, and the cooling apparatus to selectively heat or cool the workpiece 118 respectively residing thereon. The controller 170, for example, may be configured to heat the workpiece 118 in chamber 138A via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 1388 via the cooling apparatus 160, and to selectively transfer the workpiece between the external environment 132 and the vacuum or process environment 126 via control of a pump and vent 172, the respective atmospheric doors 174A, 1748 and vacuum doors 176A, 1768 of the respective chambers 138A, 1388, and workpiece transfer apparatus 178A, 1788 (e.g., a robot with an end effector 180 configured to support the workpiece concurrent with transferring the workpiece).

In one example, the workpiece 118 may be further delivered to and from the process chamber 122 such that the workpiece is transferred between a selected front opening unified pod (FOUP) 182A, 182B and chambers 138A, 138B via workpiece transfer apparatus 178A, and further transferred between the chambers 138A, 138B and the heated chuck 130 via workpiece transfer apparatus 178B. The controller 170, for example, is further configured to selectively transfer the workpiece between the FOUPs 182A, 182B, chambers 138A, 138B, and heated chuck 130 via a control of the workpiece transfer apparatus 178A, 178B.

In accordance with one exemplary aspect of the disclosure, prior to being placed on the heated chuck 130, but after the workpiece 118 is brought within the vacuum chamber 124, the workpiece 118 may be generally maintained in a high vacuum environment, whereby heat transfer is largely dominated by radiation. The workpiece 118, for example, can be positioned a predetermined distance 184 from a surface 186 of the heated chuck 130 by the workpiece transfer apparatus 178B when the workpiece is at an initial temperature (e.g., about 20° C. or approximately room temperature), and whereby the temperature of the workpiece is allowed to rise due to thermal radiation 188 emitted from the heated chuck. By allowing the temperature of the workpiece 118 to rise via the thermal radiation 188 emitted from the heated chuck 130, a relatively uniform temperature may be achieved across the workpiece by diffusing the radiated heat across the predetermined distance 184 between the workpiece and the surface 186 of the heated chuck.

In order to gain a better understanding of the disclosure, it should be first understood that various deleterious issues may exist when a relatively cold workpiece 118 (e.g., at room temperature or approximately 20° C.) is placed on, and clamped to, the surface 186 of the heated chuck 130 when the heated chuck is at a substantially high temperature (e.g., 1000° C.). For example, such a placement of a workpiece 118 (e.g., at room temperature) onto the heated chuck 130 (e.g., at a substantially higher temperature) can induce thermal stresses in the workpiece that can lead to warpage, "potato chipping", cracking of the workpiece, or other damage to the workpiece when the workpiece is clamped (e.g., electrostatically clamped) to the heated chuck. If the workpiece 118 is quickly clamped onto the heated chuck 130, for example, the workpiece generally cannot thermally expand. Such a limit in expansion, for example, can lead to stresses and breakage, thermal non-uniformities across the workpiece 118, as well as various other issues associated with the thermal stress being a "shock" to the workpiece.

Figure 2:
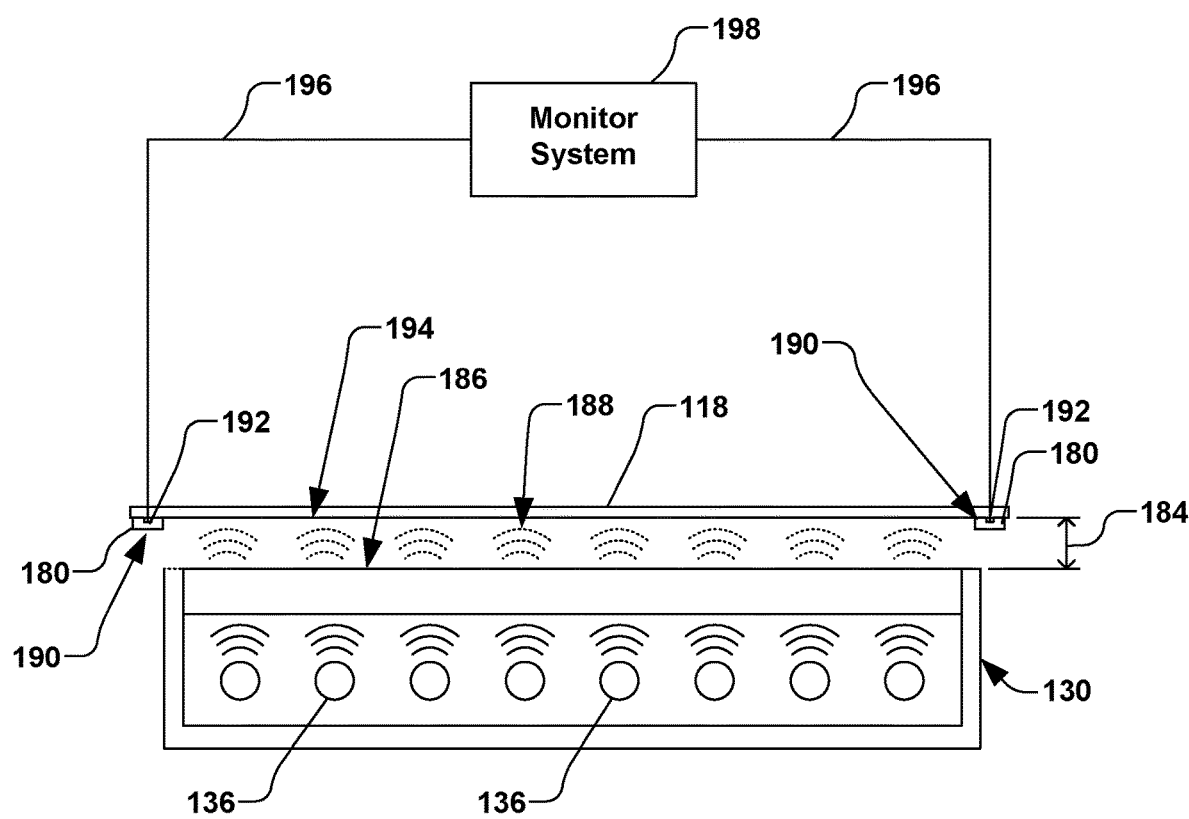
FIG. 2 is a schematic block diagram illustrating an exemplary apparatus for heating a workpiece according to another exemplary aspect of the disclosure.

The present disclosure, for example, may utilize the heated chuck 130 (e.g., a mechanical or electrostatic clamping chuck) as source of preheating of the workpiece 118, prior to any placement of the workpiece onto its surface 186. In accordance with one aspect, the end effector 180 of the workpiece transfer apparatus 1788 of FIG. 1, for example, is configured to support the workpiece 118 at the predetermined distance 184 (e.g., approximately 10 mm) above the surface 186 of the heated chuck 130, as illustrated in FIG. 2. The predetermined distance 184 between the workpiece 118 and the surface 186 of the heated chuck 130, for example, can be varied in order to change a rate of preheating, a rate of thermal absorption, and the associated heat transfer between the heated chuck and the workpiece via the radiation 188 emitted from the one or more heaters 136 of the heated chuck. Accordingly, radiation heat transfer from the heated chuck 130 is configured to heat the workpiece 118, whereby the workpiece is permitted to grow or expand thermally while resting on the end effector 180 based on its coefficient of thermal expansion (CTE).

In the past, a workpiece was placed directly on a surface of a heated chuck, whereby thermal expansion of the workpiece is accommodated by a grip and release sequence of the workpiece during clamping, thereof. For example, the conventional workpiece would be placed on, and clamped to, the surface of the chuck, and the workpiece would be heated by the chuck. In order to permit the workpiece to expand, the heated chuck would release the clamping of the workpiece, and then again clamp the workpiece onto the heated chuck after said expansion. Such a cycle of clamping and releasing would have been repeated until the desired temperature was reached, thus not only consuming time, but also leading to potential particle contamination. For example, if the workpiece was not completely flat, clamping of the workpiece to the chuck would have been difficult, or the workpiece could have been broken or otherwise create contamination particles concurrent with such clamp and release cycles.

By radiatively preheating the workpiece 118 at the predetermined distance 184 above the surface 186 of the heated chuck 130 of the present disclosure, as illustrated in FIG. 2, better uniformity of the heating across the workpiece can be attained due to a view factor between the workpiece and surface of the heated chuck being further away from the heat source (e.g., the heated chuck).

In one example, the predetermined distance 184 can be varied, whereby the workpiece 118 can be positioned at a plurality of predetermined distances from the heated chuck 130 to further control the heating of the workpiece. For example, the workpiece 118 can be initially positioned at the predetermined distance 184 (e.g., approximately 30 mm) from the surface 186 of the heated chuck 130, whereby the predetermined distance can be slowly decreased (e.g., to approximately 2-3 mm), thus minimizing thermal shock. Such a positioning of the workpiece 118 is advantageous over placing the workpiece 118 from a relatively low temperature (e.g., room temperature) directly onto the surface 186 (e.g., at 700° C.) of the heated chuck 130.

Figure 3:
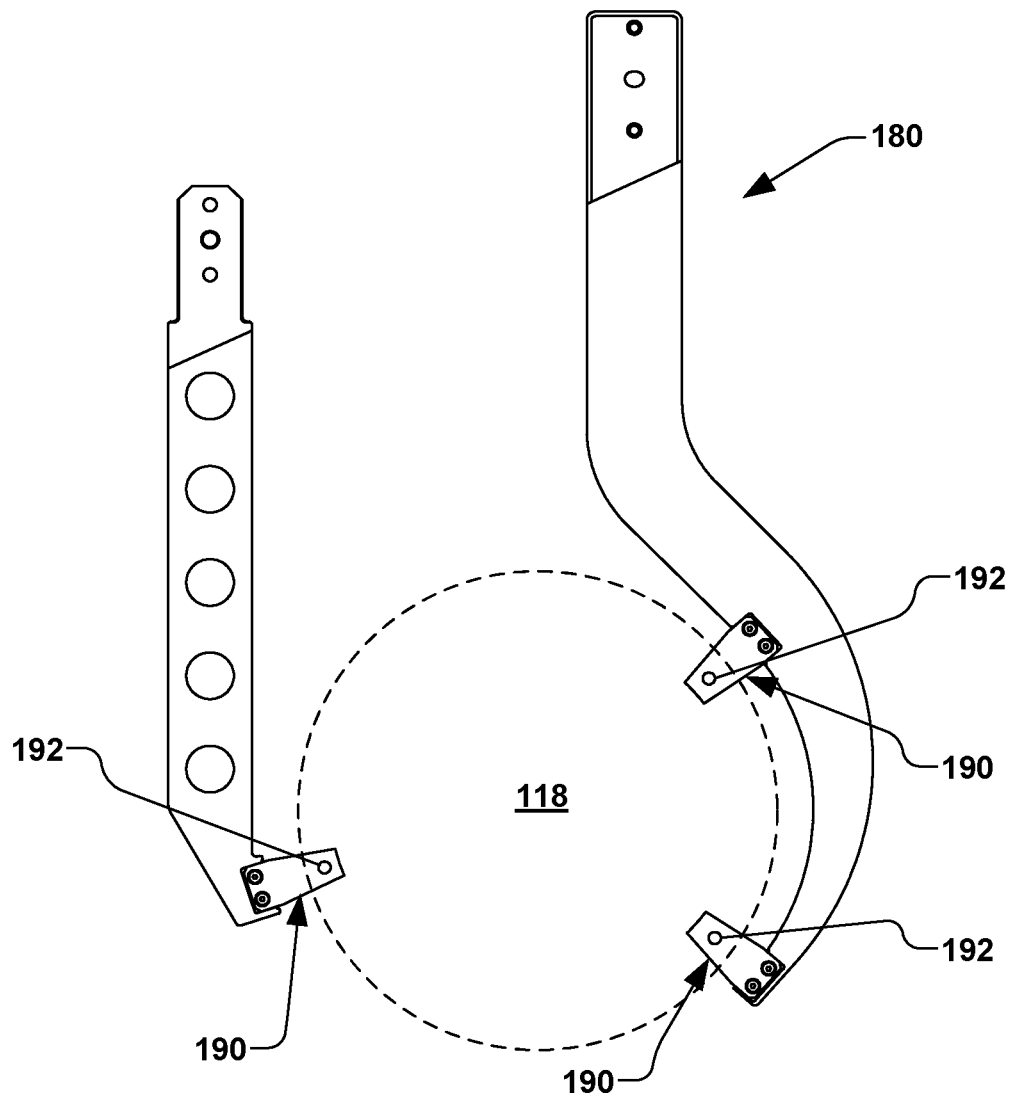
FIG. 3 is a plan view of an exemplary end effector having one or more temperature sensors according to another exemplary aspect of the disclosure.

The workpiece 118, for example, is supported by the end effector 180 via the workpiece transfer apparatus 178B (e.g., a robot) of FIG. 1. The end effector 180 of FIG. 2, for exemplar, may comprise a support member 190 such as a tray or other style of passive gripping mechanism, whereby the workpiece 118 rests on the support member by gravity, as illustrated in FIG. 2. For example, three or more support members 190 operably coupled to arms 192 of the end effector 180, as illustrated in FIG. 3, whereby the three or more support member 190 are configured to support the workpiece 118. It should be understood that while three support members 190 are illustrated, any number of support members may be implemented.

In the present example, there is no axial gripper associated with the end effector 180, whereby the workpiece 118 is permitted to freely expand both radially and axially. For example, having only one degree of constraint by the end effector 180 (e.g., gravity forcing contact between the workpiece 118 and the support members 190), and the remaining two degrees of freedom of movement of the workpiece allow the workpiece to expand without deleterious results.

In the present example, the heated chuck 130 is positioned vertically below the workpiece 118, as illustrated in FIG. 2, whereby the workpiece is held under its outside perimeter by the support members 190 of the end effector 180. Thus, in accordance with the present disclosure, the end effector 180 is configured to maneuver and place the workpiece 118 at the predetermined distance 184 from the surface 186 of the heated chuck 130 for selective heating of the workpiece. The predetermined distance 184, for example, can be varied according to the desired radiative emission 188 to be received at the workpiece 118 from the heated chuck 130.

In one example, after a predetermined temperature rise and/or a predetermined amount of time has elapsed, the workpiece 118 can be placed directly on the surface 186 of the heated chuck 130, and selectively clamped thereto. It should be understood that the preheat apparatus 152 of FIG. 1, for example, may be optionally utilized. For example, the preheat apparatus 152 may be utilized to preheat the workpiece a predetermined amount prior to being placed the predetermined distance 184 from the heated chuck 130 or other heated apparatus. Alternatively, the preheat apparatus 152 may be eliminated or otherwise not utilized to heat the workpiece 118 prior to the selective placement at the predetermined distance 184 from the surface 186 of the heated chuck 130 shown in FIG. 2

The present disclosure further contemplates a similar placement of the workpiece 118 at the predetermined distance 184 from the heated chuck 130 when the workpiece is removed from the surface 186 of the heated chuck (e.g., after an implantation of ions, therein). As such, thermal non-uniformities may be further mitigated during a cool-down of the workpiece 118, but in a reverse manner as that described above.

In another example, variations of the predetermined distance 184 and/or time spent at various predetermined distances are contemplated. For example, instead of distinct predetermined distances 184 being utilized (e.g., 10 mm and 30 mm), a rate of movement (e.g., generally continuous movement) of the workpiece 118 toward or away from the heated chuck 130 is contemplated, such as 1 mm every 5 seconds, or any other rate suitable for a desired heat transfer and workpiece throughput. As such, any combination of variation of the predetermined distance 184 over time is contemplated, as well as a continuum of speed or a variable speed, where the determination of speed, time, and/or rate may be characterized for each workpiece 118 and/or material constituency of the workpiece. It is further noted that the controller 170 of FIG. 1, for example, is appropriately configured to provide such placement and/or movement of the workpiece 118 with respect to the heated chuck 130.

As discussed above, the present disclosure appreciates that soaking of the workpiece 118 above the heated chuck 130 prior to being placed on the surface 186 of the heated chuck of FIG. 2 can advantageously reduce stress, particle contamination, breakage of the workpiece, etc. However, without temperature feedback, an uncertainty exists as to when thermal equilibrium is reached before placement of the workpiece 118 on the surface 186 of the heated chuck 130. A conservative approach to attaining thermal equilibrium is to provide a predetermined soak routine, whereby the workpiece 118 is soaked about the heated chuck 130 for a predetermined period of time. However, the predetermined period of time in a predetermined soak routine may be greater than the time associated with thermal equilibrium, or the predetermined period of time may not be fully optimized for a particular workpiece. In other words, the predetermined period of time at which the workpiece 118 soaks in a predetermined soak routine is "blind" and only based on time, such as holding the workpiece for 20 seconds, hovering above the heated chuck 130 for 25 seconds, and then placing the workpiece on the surface 186 of the heated chuck.

The present disclosure overcomes disadvantages associated with such a predetermined soak routine by further providing a temperature sensor 192 that is associated with (e.g., embedded in) the end effector 180, whereby the temperature sensor is configured to make direct contact with the workpiece 118 and provide a signal indicative of the temperature of the workpiece in order to optimize the sequence of events associated with reaching thermal equilibrium with the heated chuck 130. The temperature sensor 192, for example, comprises a thermocouple (TC), resistance temperature detector (RTD), or other temperature sensor configured to directly contact a backside 194 of the workpiece 118 and to measure the of the workpiece 118, thus defining a measured temperature 196 associated with each temperature sensor. The measured temperature(s) 196 may be further fed to a thermal monitoring system 198, as shown in FIG. 1 to provide feedback to the controller 170.

Thus, instead of being simply time-based, the present disclosure utilizes the signal indicative of a measured temperature of the workpiece 118 for placement of the workpiece on the heated chuck 130. The workpiece 118 may be hovered above the heated chuck 130 at the predetermined distance 184 as illustrated in FIG. 2. Once the signal indicates that the measured temperature of the workpiece 118 is above a predetermined temperature (e.g., 200° C.), an instruction may be given to place the workpiece on the surface 186 of the heated chuck 130 or platen. As such, instead of being solely time-based and relatively blind to the temperature of the workpiece 118, the system 100 of FIG. 1 can be configured to hover the workpiece over the heated chuck 130, and once the predetermined temperature is reached, the workpiece can be placed on the surface 186 of the heated chuck, whereby the operation is optimized to permit the workpiece to reach the predetermined temperature without wasting time simply resting at equilibrium.

The support member 190, for example, may be comprised of ceramic or other material. An understanding of how quickly the workpiece 118 is heated to the predetermined temperature, for example, can be utilized to determine when the workpiece is placed on the heated chuck 130 of FIG. 2. As illustrated in FIG. 3, each temperature sensor 192, for example, is operably coupled to (e.g., embedded within) the respective support member 190, whereby the temperature sensor is configured to directly contact and measure the temperature of the workpiece 118. Any number of temperature sensors 192 may be provided, such as one or more temperature sensors being operably coupled to one or more of the support members 190. In the present example, three support members 190 are provided, however any number of support members may be provided, such that the workpiece 118 is at least partially supported by the support members.

The present disclosure appreciates that the system 100 may be characterized to understand that when the measured temperature 196 at a particular temperature sensor 192 is at particular temperature (e.g., 100° C.), then the temperature of other locations on the workpiece (e.g., edges versus center) may differ.

In one example, the system 100 of FIG. 1 may be characterized by placing the workpiece 118 in front of the heated chuck 130, whereby a maximum temperature is attained when the workpiece resides there indefinitely. For example, if the workpiece 118 is placed in front of the heated chuck for an hour, the measured temperature 196 of FIG. 2 will flatline at a maximum temperature. The present disclosure appreciates that such an extended period of time, however, is not necessary, and that the workpiece 118 may be placed on the heated chuck 130 when the measured temperature is within a threshold temperature (e.g., within 5% of the maximum temperature). As such, when the workpiece 118 reaches the threshold temperature, the workpiece can be moved or placed on the heated chuck. Feedback from the temperature sensor 192, for example, can be utilized to trigger movement of the workpiece 118 to the heated chuck 130 in order to optimize throughput and to ensure that the workpiece is in a desired condition prior to implantation.

As such, the controller 170 of FIG. 1 may be configured to selectively transfer the workpiece 118 from the end effector 180 to the support surface 186 of the heated chuck 130 based, at least in part, on the measured temperature reaching the threshold temperature associated with the predetermined temperature.

The present disclosure appreciates that a large temperature change can occur at the beginning of the workpiece 118, but then as the measured temperature 196 approaches the predetermined temperature of the heated chuck 130, the rate of heat transfer and temperature change decreases. When the rate of heat transfer reduces, the temperatures of the workpiece 118 and heated chuck 130 are close to equilibrium. Thus, the controller 170 may be configured to control the workpiece transfer apparatus 1788, for example, to selectively vary the predetermined distance 184 of FIG. 2 based, at least in part, on the measured temperature and/or a rate of change of the measured temperature.

While the present example relates to placing the workpiece 118 above the heated chuck 130 for heating of the workpiece, the present disclosure is applicable to any desired temperature change of the workpiece, such as a cooling of the workpiece with respect to the chilled workpiece support 162 of FIG. 1. Further, the present disclosure may be utilized in any apparatus of the ion implantation system 100, such as when transferring the workpiece 118 from the preheat apparatus 152 to the heated chuck 130 for heating of the workpiece, whereby the temperature sensor 192 is configured to determine the temperature of the workpiece when transferred from the preheat station, but prior to being placed on the heated chuck. The present disclosure, for example, attains the temperature of the workpiece 118 concurrent with the transfer in order to ensure that the temperature of workpiece is at a minimum temperature prior to being placed on the thermal chuck 120, thus further improving reliability of the system.

For example, the present disclosure may be further utilized to determine a failure of the heating of the workpiece 118 in the preheat apparatus 152 that would otherwise not be determined using only a time-based soak. For example, if the workpiece 118 is offset or not resting flat on the workpiece support in the preheat apparatus 152, or the temperature of the preheat station is not providing the correct heating of the workpiece, the present disclosure can signal a fault or perform other actions. If the measured temperature, for example, does not fall within a predetermined temperature range, a fault may be signaled, or the workpiece 118 may be placed back in the preheat apparatus 152 in another attempt to heat the workpiece to the desired temperature.

If the measured temperature indicates that the workpiece 118 has been overheated, an alarm or other signal may be triggered to alert an operator to perform maintenance, etc. As such, the present disclosure is applicable to various processing steps involved in processing a workpiece 118, whereby the measured temperature of the workpiece is utilized as feedback to determine whether continued operations on the workpiece, such as placing the workpiece on the ESC, should be performed.

For example, in accordance with another aspect of the disclosure the heated chuck 130 can be utilized as a preheat station positioned inside or proximate to the process chamber 122, instead of, or in addition to, having an independent preheat apparatus 152 located in a load lock chamber 138A, or elsewhere in the system 100. For example, multiple heated chucks 130 may be implemented within the process chamber 122 of FIG. 1, whereby heating of one or more workpieces 118 may be accomplished without the deleterious effects discussed above. As such, costs associated with the system can be advantageously reduced.

The present disclosure is further advantageous over preheating that may have been conventionally performed solely via the independent preheat apparatus 152 located in the load lock chamber 138A, in that variables such as time and temperature are limited when conventional preheat is performed in atmosphere. By utilizing the heated chuck 130 in the vacuum of the process environment 126 as a source for preheating the workpiece 118 prior to high temperature processing, and the aforementioned control of the heating via feedback from the temperature sensors 192, additional control of the heating of the workpiece is advantageously provided by the predetermined distance 184 of FIG. 2.

Further, the present disclosure also contemplates preheating of the workpiece 118 in the load lock chamber 138A for increased throughput, while the preheating of workpiece at the heated chuck 130 disclosed herein advantageously increases uniformity and mitigates thermal shock to the workpiece. As such, significant additional benefits may be realized in processing various compositions of the workpieces 118, such as a workpiece comprising or comprised of silicon carbide.

Figure 4:
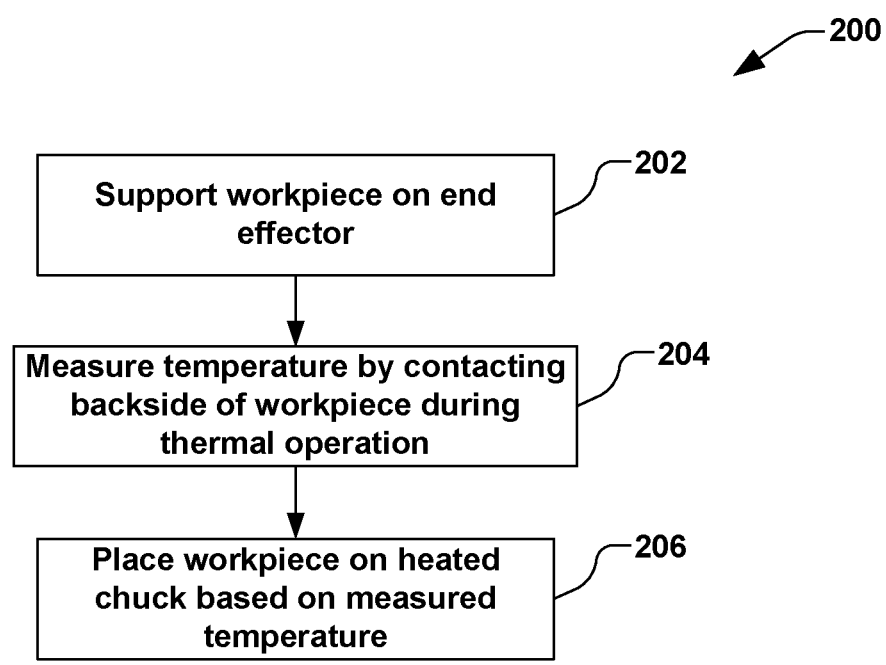
FIG. 4 is a block diagram illustrating an exemplary method for processing of workpieces according to another exemplary aspect of the disclosure.

The present disclosure further provides a method 200 in FIG. 4 for processing a workpiece and controlling a temperature, thereof. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 4, the method 200 begins at act 202, wherein the workpiece is placed in view of a thermal apparatus, such as a heated chuck, by an end effector. The heated chuck, for example, comprises a heat source in a vacuum, whereby the workpiece is positioned at a configurable predetermined distance from the thermal apparatus. Heat is transferred between the thermal apparatus and workpiece and a temperature of a backside of the workpiece is measured in act 204, therein defining a measured temperature. Measuring the temperature of the backside surface of the workpiece, for example, is performed via a temperature sensor contacting the backside surface. In act 206, the workpiece is transferred from the end effector to the support surface of the thermal chuck based, at least in part, on the measured temperature.

The workpiece, for example, is permitted to reach a threshold temperature associated with the predetermined temperature before being placed directly on the chucking surface in act 206, wherein the threshold temperature is a percentage of the predetermined temperature.

In accordance with another aspect, the aforementioned methodology may be implemented using computer program code in one or more of a controller, general purpose computer, or processor based system. As illustrated in FIG. 7, a block diagram is provided of a processor based system 500 in accordance with another embodiment. The processor based system 500 is a general purpose computer platform and may be used to implement processes discussed herein. The processor based system 500 may include a processing unit 502, such as a desktop computer, a workstation, a laptop computer, or a dedicated unit customized for a particular application. The processor based system 500 may be equipped with a display 504 and one or more input/output devices 506, such as a mouse, a keyboard, or printer. The processing unit 502 may include a central processing unit (CPU) 508, memory 510, a mass storage device 512, a video adapter 514, and an I/O interface 516 connected to a bus 518.

The bus 518 may be one or more of any type of several bus architectures including a memory bus or memory controller, a peripheral bus, or video bus. The CPU 508 may include any type of electronic data processor, and the memory 510 may include any type of system memory, such as static random access memory (SRAM), dynamic random access memory (DRAM), or read-only memory (ROM).

The mass storage device 512 may include any type of storage device configured to store data, programs, and other information and to make the data, programs, and other information accessible via the bus 518. The mass storage device 512 may include, for example, one or more of a hard disk drive, a magnetic disk drive, or an optical disk drive.

The video adapter 520 and the I/O interface 522 provide interfaces to couple external input and output devices to the processing unit 502. Examples of input and output devices include the display 504 coupled to the video adapter 520 and the I/O device 506, such as a mouse, keyboard, printer, and the like, coupled to the I/O interface 522. Other devices may be coupled to the processing unit 502, and additional or fewer interface cards may be utilized. For example, a serial interface card (not shown) may be used to provide a serial interface for a printer. The processing unit 502 also may include a network interface 524 that may be a wired link to a local area network (LAN) or a wide area network (WAN) 526 and/or a wireless link.

It should be noted that the processor based system 500 may include other components. For example, the processor based system 500 may include power supplies, cables, a motherboard, removable storage media, cases, and the like. These other components, although not shown, are considered part of the processor based system 500.

Embodiments of the present disclosure may be implemented on the processor based system 500, such as by program code executed by the CPU 508. Various methods according to the above-described embodiments may be implemented by program code. Accordingly, explicit discussion herein is omitted.

Figure 5:
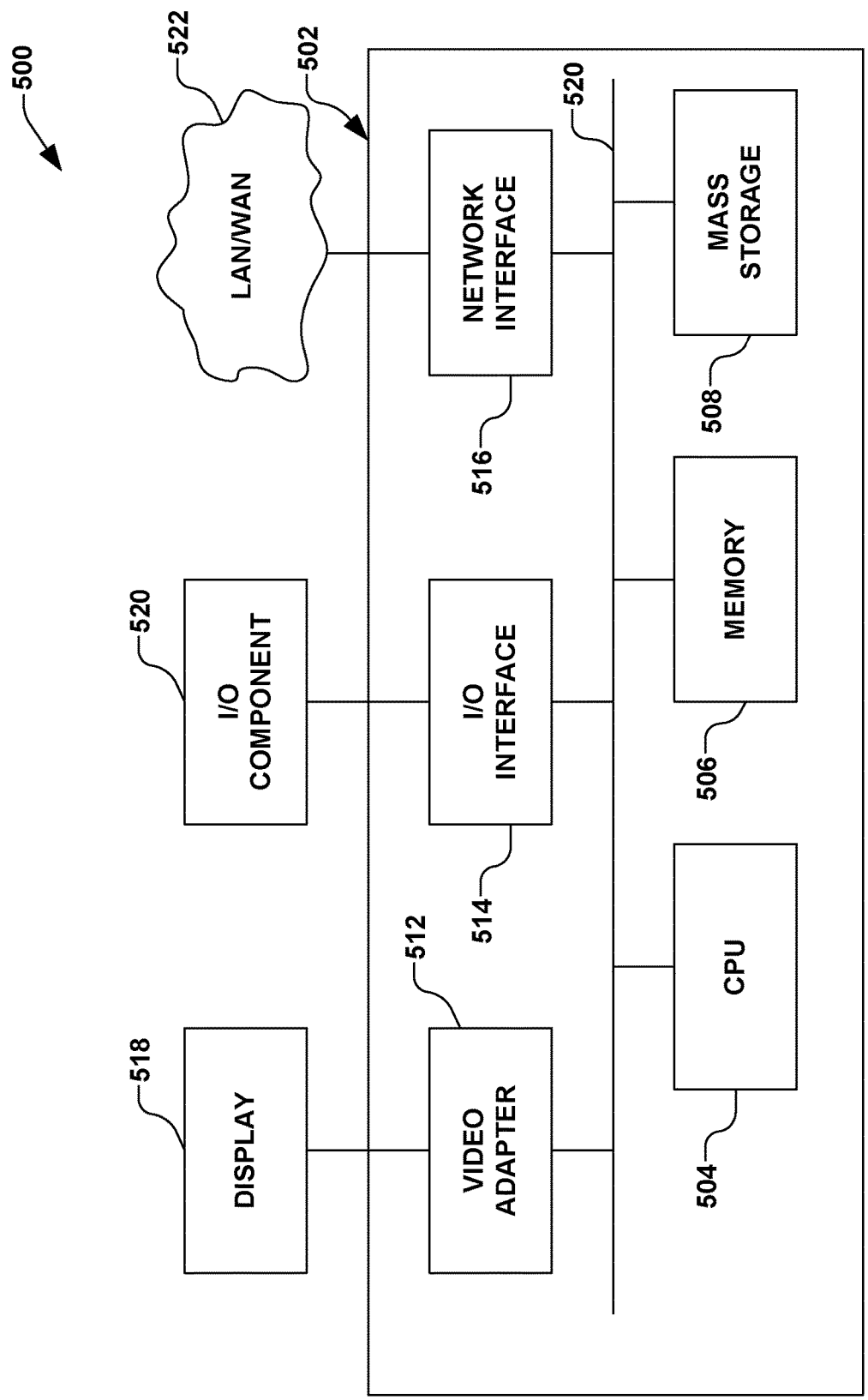
FIG. 5 is a block diagram illustrating an exemplary control system in accordance with another aspect.

Further, it should be noted that various modules and devices in the Figures may be implemented on and controlled by one or more processor based systems 500 of FIG. 5. Communication between the different modules and devices may vary depending upon how the modules are implemented. If the modules are implemented on one processor based system 500, data may be saved in memory 510 or mass storage 512 between the execution of program code for different steps by the CPU 508. The data may then be provided by the CPU 508 accessing the memory 510 or mass storage 512 via bus 518 during the execution of a respective step. If modules are implemented on different processor based systems 500 or if data is to be provided from another storage system, such as a separate database, data can be provided between the systems 500 through I/O interface 522 or network interface 524. Similarly, data provided by the devices or stages may be input into one or more processor based system 500 by the I/O interface 522 or network interface 524. A person having ordinary skill in the art will readily understand other variations and modifications in implementing systems and methods that are contemplated within the scope of varying embodiments.

In summary, the present disclosure can provide improved temperature control of a workpiece in a high temperature ion implantation. A temperature sensor (e.g., a thermocouple, RTD, or similar device) is implemented to monitor the temperature of the workpiece and to control the placement of the workpiece on the heated apparatus (e.g., a thermal chuck or heated platen) in order to more accurately and precisely control the temperature of the workpiece and improve efficiency and throughput of the system. The temperature sensor, for example, provides real-time workpiece temperature and feeds this information into the control system to dynamically control the heating of the workpiece to achieve a specified workpiece temperature.

The temperature sensor, for example, can be utilized to provide control feedback in a closed-loop system for providing direct measurement of the workpiece temperature and control of the workpiece transfer apparatus. In utilizing a thermal device that contacts the workpiece, such as an RTD and/or thermocouple, the backside of the workpiece may be contacted. However, it is also contemplated that the upstream or front side of the workpiece may be contacted by the RTD or TC, or both front side and backside may be contacted. For TC or RTD contact thermal devices, since such devices comprise significantly smaller sensors, contact with the backside of the workpiece would be preferable over contact with the front side, but either locations are considered to fall within the scope of the present disclosure.

Multiple locations for the temperature measurement on the workpiece may be further utilized. For example, temperatures may be monitored at several locations around the workpiece uniformity (e.g., various zones may be adjusted and controlled for better uniformity). Thus, having multiple TCs or RTDs at multiple locations will improve uniformity and temperature accuracy.

Further, redundant TCs/RTDs may be implemented in order to account for potential high failure rates of the devices. For example, by implementing redundant TCs/RTDs, if one TC or RTD fails, the output from the remaining TCs/RTDs may be compared with each other. As such, if a large temperature difference is identified between primary and secondary (redundant) sensors, such a scenario could be identified as a failure of the TC or RTD, and the system may be placed in a "hold" mode, rather than attempting to drive the heater to match that output of the TC/RTD. Redundant TCs/RTDs, for example, may be positioned close to one another for redundancy, while for uniformity, the present disclosure may provide pairs of TCs/RTDs that placed at various positions of contact with the end effector. For example, the TC/RTDs may be positioned 120-180 degrees with respect to one another to provide an understanding of uniformity.

While thermocouples and RTDs are specifically discussed, any type of sensor configured to directly measure the temperature of the workpiece is contemplated as falling within the scope of the present disclosure. In one example, for a thermal sensor that contacts the backside of the workpiece, a spring-loaded TC may be utilized, where the spring-loaded TC is compliant such that the workpiece puts pressure on the sensor, but only with a minimal amount of contact pressure. The TC, for example, may have a very smooth surface with small contact area and thermal mass configured to match the workpiece and to eliminate heat sinks or heat transfer.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece processing system, comprising:
    a workpiece transfer apparatus;
    an end effector operably coupled to the workpiece transfer apparatus and configured to selectively support a workpiece;
    one or more temperature sensors operably coupled to the end effector, wherein the one or more temperature sensors are configured to contact a backside of the workpiece and to respectively measure one or more temperatures of the workpiece, therein respectively defining one or more measured temperatures;
    a thermal apparatus having a support surface at a predetermined temperature; and
    a controller configured to control the workpiece transfer apparatus to selectively support the workpiece at a predetermined distance from the support surface of the thermal apparatus, thereby transferring heat between the support surface and the workpiece, and to selectively transfer the workpiece from the end effector to the support surface of the thermal apparatus based, at least in part, on the one or more measured temperatures.

2. The workpiece processing system of claim 1, wherein the thermal apparatus comprises a heated clamping apparatus configured to radiate heat from the support surface and to selectively clamp the workpiece to the support surface.

3. The workpiece processing system of claim 2, wherein the thermal apparatus comprises a heated electrostatic chuck.

4. The workpiece processing system of claim 1, wherein the one or more temperature sensors comprises one or more of thermocouple and an RTD.

5. The workpiece processing system of claim 1, wherein the end effector comprises three or more support members operably coupled to the end effector, wherein the three or more support members are configured to selectively contact and support the workpiece.

6. The workpiece processing system of claim 5, wherein the one or more temperature sensors are operably coupled at least one of the three or more support members.

7. The workpiece processing system of claim 5, wherein three or more temperature sensors are operably coupled to the three or more support members, respectively.

8. The workpiece processing system of claim 1, wherein the controller is further configured to control the workpiece transfer apparatus to selectively vary the predetermined distance based, at least in part, on the measured temperature.

9. The workpiece processing system of claim 1, wherein the controller is configured to selectively transfer the workpiece from the end effector to the support surface of the thermal apparatus based, at least in part, on a rate of change of the measured temperature.

10. The workpiece processing system of claim 1, wherein the controller is configured to selectively transfer the workpiece from the end effector to the support surface of the thermal apparatus based, at least in part, on the measured temperature reaching a threshold temperature associated with the predetermined temperature.

11. The workpiece processing system of claim 10, wherein the threshold temperature is within approximately 5 percent of the predetermined temperature.

12. The workpiece processing system of claim 1, wherein the thermal apparatus comprises a chilled support apparatus configured to absorb heat from the workpiece.

13. A workpiece processing system, comprising:
    a workpiece transfer apparatus;
    an end effector operably coupled to the workpiece transfer apparatus, wherein the end effector comprises three or more support members operably coupled to the end effector and configured to selectively contact and support the workpiece;
    one or more temperature sensors operably coupled to the one or more support members, wherein the one or more temperature sensors are configured to contact a backside of the workpiece and to respectively measure one or more temperatures of the workpiece, therein respectively defining one or more measured temperatures;
    a heated chuck having a support surface at a predetermined temperature, wherein the heated chuck is configured to radiate heat from the support surface; and
    a controller configured to control the workpiece transfer apparatus to selectively support the workpiece at a predetermined distance from the support surface of the heated chuck, thereby radiatively heating the workpiece, and to selectively transfer the workpiece from the end effector to the support surface of the heated chuck based, at least in part, on the one or more measured temperatures.

14. The workpiece processing system of claim 13, wherein the one or more temperature sensors comprises one or more of thermocouple and an RTD.

15. The workpiece processing system of claim 13, wherein three or more temperature sensors are operably coupled to the three or more support members, respectively.

16. The workpiece processing system of claim 13, wherein the controller is further configured to control the workpiece transfer apparatus to selectively vary the predetermined distance based, at least in part, on the measured temperature.

17. The workpiece processing system of claim 13, wherein the controller is configured to selectively transfer the workpiece from the end effector to the support surface of the heated chuck based, at least in part, on a rate of change of the measured temperature.

18. The workpiece processing system of claim 13, wherein the controller is configured to selectively transfer the workpiece from the end effector to the support surface of the heated chuck based, at least in part, on the measured temperature reaching a threshold temperature associated with the predetermined temperature.

19. The workpiece processing system of claim 18, wherein the threshold temperature is within approximately 5 percent of the predetermined temperature.

20. A method for controlling a temperature of a workpiece, comprising:

measuring a temperature of a backside surface of the workpiece when the workpiece resides on an end effector above a clamping surface of a thermal chuck via a temperature sensor contacting the backside surface, therein defining a measured temperature; and
transferring the workpiece from the end effector to the clamping surface of the thermal chuck based, at least in part, on the measured temperature.

* * * * *